United States Patent [19]
Pernick

[11] Patent Number: 5,363,233
[45] Date of Patent: Nov. 8, 1994

[54] OPTICAL CORRELATOR USING FIBER OPTICS LASERS

[76] Inventor: Benjamin J. Pernick, 110-11 Queens Blvd., Forest Hills, N.Y. 11375

[21] Appl. No.: 115,660

[22] Filed: Sep. 3, 1993

[51] Int. Cl.$^5$ .............................................. G02F 1/01
[52] U.S. Cl. ..................... 359/316; 359/160; 359/310; 372/6; 385/116
[58] Field of Search ............... 359/306, 310, 316, 133, 359/160, 180; 385/115, 116; 372/6

[56] References Cited

U.S. PATENT DOCUMENTS

| | | | |
|---|---|---|---|
| 5,061,035 | 10/1991 | Rogers, Jr. | 385/115 |
| 5,245,467 | 9/1993 | Grasso et al. | 372/6 |
| 5,293,437 | 3/1994 | Nixon | 385/115 |

FOREIGN PATENT DOCUMENTS 0216311  10/1985  Japan ................................ 385/115

Primary Examiner—Scott J. Sugarman
Assistant Examiner—Thomas Robbins
Attorney, Agent, or Firm—Pollock, Vande Sande & Priddy

[57] ABSTRACT

A plurality of fiber optic laser members are supported in an apertured plate so as to form an array supplied by an optical pump. Individual members may have the light passing there through modulated by respective modulators. Light from the fiber optic laser array illuminates an optical storage medium which stores information. The resulting output undergoes Fourier transformation and optical filtering. Filtered light then undergoes inverse Fourier transformation and detection.

1 Claim, 2 Drawing Sheets

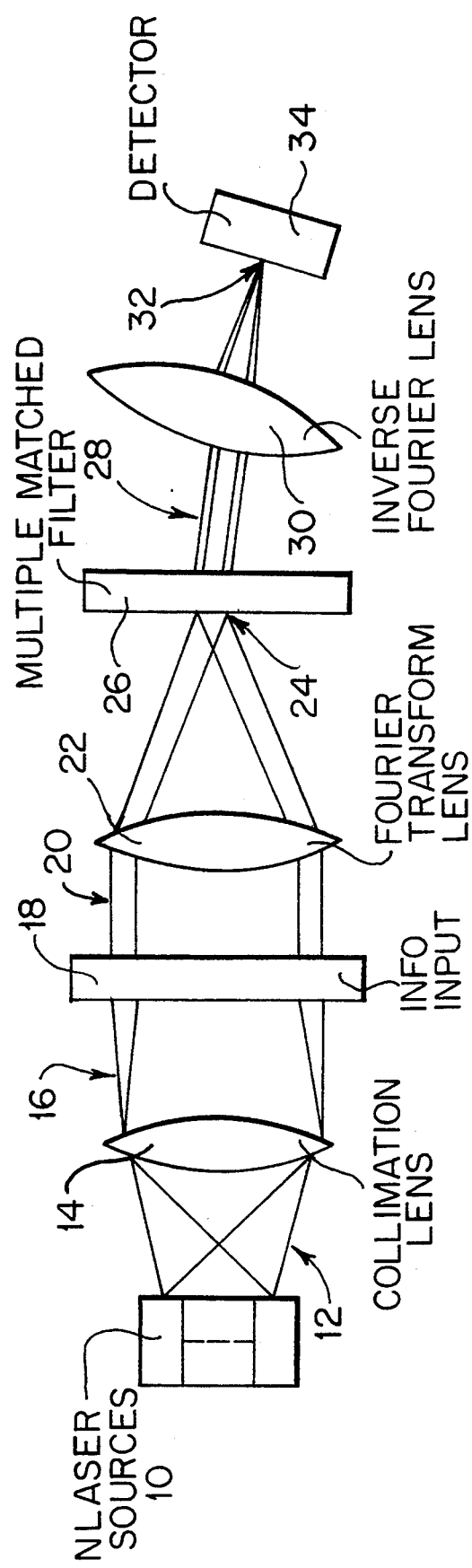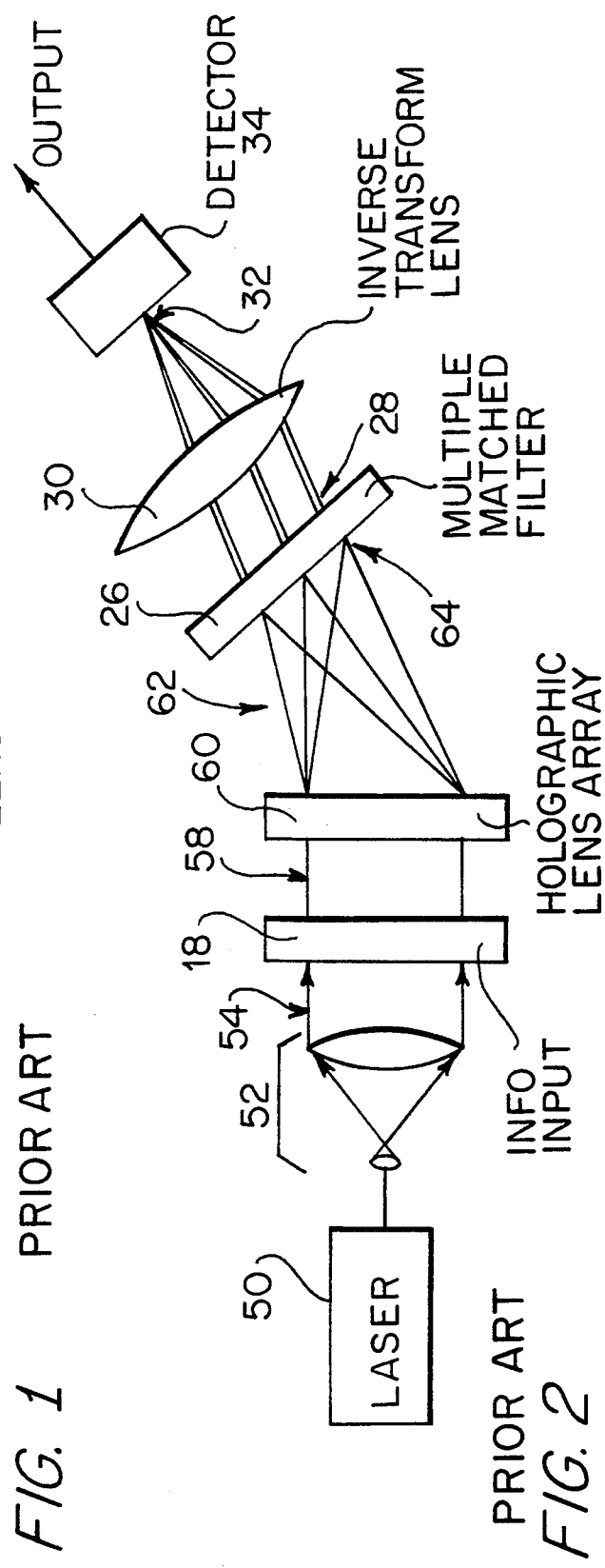
FIG. 1 PRIOR ART
FIG. 2 PRIOR ART

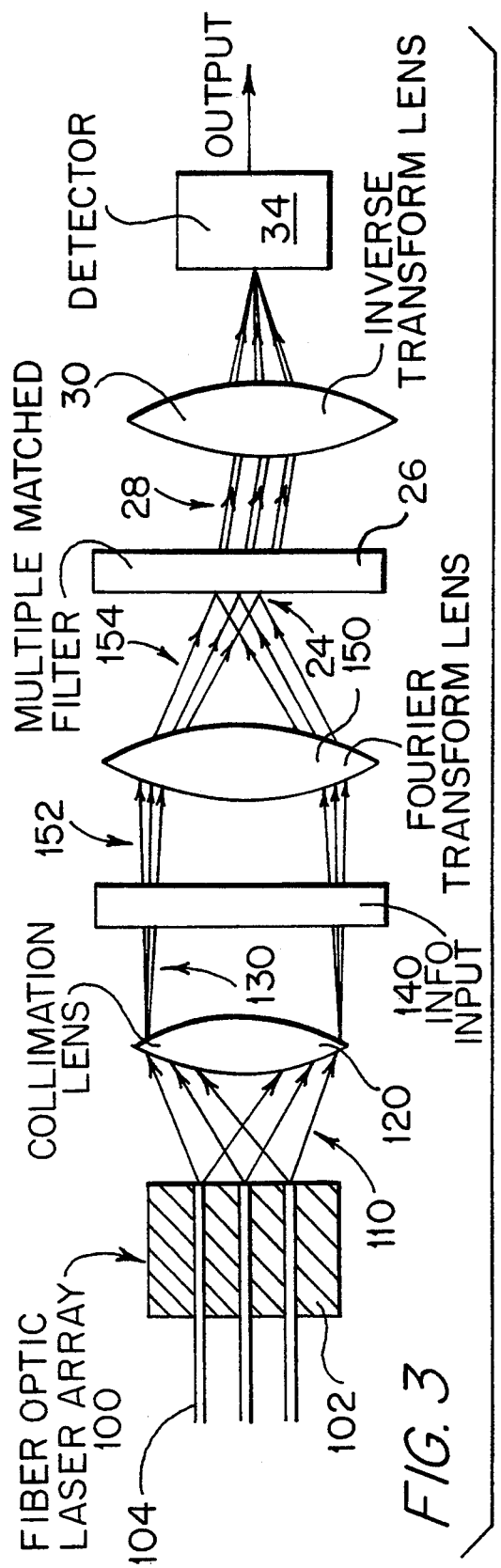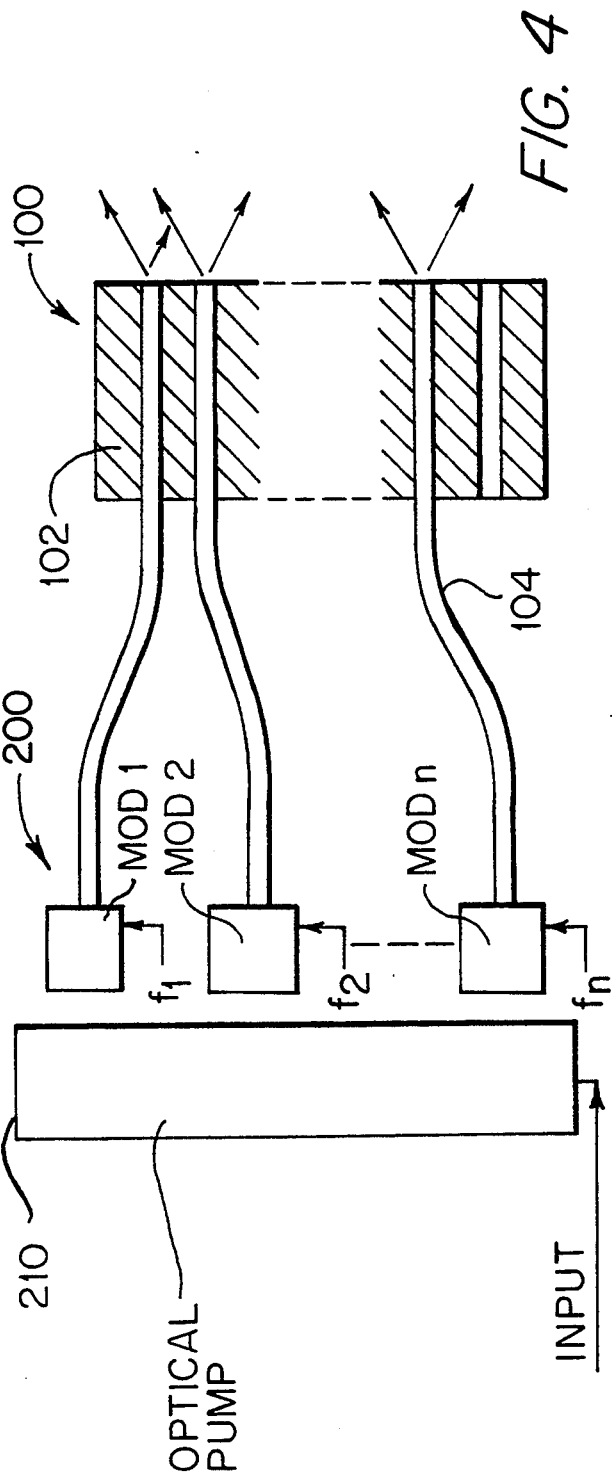

OPTICAL CORRELATOR USING FIBER OPTICS LASERS

FIELD OF THE INVENTION

The present invention relates to optical correlators, and more particularly to an optical correlator using laser sources.

BACKGROUND OF THE INVENTION

An optical correlator featuring multiple matched filter arrays requires a plurality of laser beams to address the spatially separated matched filter channels. For example, if N filter channels are to be simultaneously utilized in the correlation process, then N separate laser beams are needed.

BRIEF DESCRIPTION OF THE FIGURES

The above-mentioned objects and advantages of the present invention will be more clearly understood when considered in conjunction with the accompanying drawings, in which:

FIG. 1 is a schematic diagram of a prior art optical correlator utilizing individual laser sources;

FIG. 2 is a schematic illustration of a prior art optical correlator employing a holographic lens array;

FIG. 3 is a schematic representation of the present optical correlator employing a fiber optic laser array;

FIG. 4 is a schematic illustration of the present invention wherein each fiber optic laser has its light individually modulated.

One simple implementation of such a correlator as prior art is illustrated in FIG. 1. The N-laser sources 10 each emit diverging beams 12. The beams are collimated with lens 14 and the collimated array of beams 16 illuminates an optical component 18 that contains the input information to be processed. For example, the information may be contained on a film record or a spatial light modulator. The exiting beams 20 are collected by a Fourier transform lens 22 and brought to an array of focused beams 24 that impinge on an optical component 26 that contains the multiple matched filter or spatial filter array. A portion of the light emerging (28) from the optical component 26 is collected by a so-called inverse transform lens 30 and brought to a focus 32 onto a detector 34. The detector output is related mathematically to the correlation of the input information with that stored in the multiple matched filter array as memory elements.

This setup is very impractical if a large number of beams is required. For compactness, the N-laser sources could be comprised of an array of laser diodes. However, a major drawback is that the beam profiles tend to be elliptic rather than circular in cross section. Pinhole spatial filtering would be relatively more involved and difficult to implement compared to pinhole filtering of a single gas laser source. Also, alignment of the laser sources would be tedious and time consuming.

A second prior art arrangement uses a special holographic optical element, a so-called multiple holographic lens to generate an array of focused beams. This system is illustrated in FIG. 2. Those components being identical with those of the system of FIG. 1 will be indicated by the same reference numeral. Radiation from a single laser source 50 is expanded and collimated with optical components 52. The single collimated beam 54 illuminates the optical component 18 that contains the input information to be processed. The exiting beam 58 is incident on the multiple holographic lens array component 60. A multiplicity of beams 62 generated by 60 form an array of focused beams 64. This array impinges on the multiple matched filter array 26. A portion of light (28) exiting the filter 26 is similar in content and function as described in connection with FIG. 1.

There are a number of shortcomings associated with this arrangement. The multiple holographic lens array is not very efficient. Diffraction efficiency values for holographic lenses with good focusing features depend on the number of beams N in the array, decreasing with increasing N. The efficiency in general is relatively low compared to conventional lenses. Secondly, the diffracted beams are focused off axis thereby introducing aberrations in the focused light distribution. Also, the photographic emulsion or photopolymer film on which the hologram is stored should be used in a so-called liquid gate or sandwiched between two optical flats with an optical cement whose index of refraction is closely matched to that of the hologram component. This is a costly procedure to achieve high quality performance from the multiple holographic lens array.

BRIEF DESCRIPTION OF THE PRESENT INVENTION

The present invention uses an array of fiber optic lasers (FOL's) as sources of laser light for the correlator. Conventional single mode rare-earthdoped optical fibers can provide high power outputs and single mode performance. Such an implementation removes the need for separate bulk laser components as required in the prior art setup of FIG. 1 and provides circular rather than elliptic beam geometries. It also replaces the multiple holographic lens component in the prior art system of FIG. 2 thereby increasing the light throughput efficiency and eliminates the need for a liquid gate or sandwiched holographic plate. Furthermore, because of the relatively small circular diameter of FOL, a pinhole filter and expansion optics would not be needed. Since a system using a FOL would be an in-line set-up, aberrations of the focused spot would be avoided.

DETAILED DESCRIPTION OF THE INVENTION

FIG. 3 illustrates schematically how FOL's would be used in an optical correlator. Components identical to those of the prior art are denoted by the same reference numerals. The FOL array 100 would be held in an apertured support mount 102 forming a two-dimensional array. Emerging light beams 110 are collimated with a lens 120 and proceed to illuminate the input component 140. Note that the individual collimated beams 130 are not parallel to each other but have slightly different angle deflections. The amount of angle deflection depends upon the spacing of individual fibers 104 and on the focal length of the collimator lens 120.

Light 152 transmitted through the input component 140 is collected by a Fourier transform lens 150 which focuses the individual beams 154 into separate focused spots 24 incident on the multiple matched filter 26. The light exiting the filter 26 is collected by an inverse transform lens 30 and the beams 32 are focused on the detector 34. As before, the detector output represents the correlation of the input information with the image stored in the filter 26.

Two applications can be directly carried out with the inventive assembly just described that cannot be done with the holographic system shown in the prior art of FIG. 2 and will now be described. As shown in FIG. 4, each FOL 104 has an associated temporal intensity modulation signal (e.g., a sine wave modulation at specific temporal frequencies) imposed by a corresponding modulator Mod. 1–Mod. N. The modulators 200 can be electrically driven (e.g., electro-optic effect, acousto-optic effect), or optically driven (e.g., photoretraction). Light from a given modulated FOL passes through the following components shown in FIG. 3: collimator lens 120, the input component 140, and the Fourier transform lens 150, to be focused onto one of the stored spatial filters in 26, as shown in FIG. 3. Thus, there is a one-to-one correspondence between a modulation frequency and a spatial filter containing information about a target image of interest. A single correlation plane can thereby be used to accommodate more than one target of interest. At a particular peak output in the correlation plane, the temporal modulation frequency of the detected signal is a direct indication of which target is responsible for the observed detector output. In contrast, the prior art holographic system of FIG. 2 would require as many separate correlation planes as there are targets to be recognized.

The inventive system of FIG. 4 can also be used for an application that involves only a single target but requires an indication of such features as the target orientation or size. In a similar fashion to the above-mentioned application, a measurement of the modulation frequency would be used to determine which filter and consequently which target feature correlates best of all.

Another unique feature of this invention is the ability to increase the capacity of the correlator by simply adding one or more FOL's to the source array. The FOL support 102 can include provisions for the addition of more FOL's as part of its specific design. The FOL's are optically pumped by component 210 in either a CW or pulsed fashion. Several pumping arrangements are described in the publication: Stephen G. Grubb, "Fiber Technology Ushers in New Laser Devices," *Laser Focus World*, 231–238 (1991). Of particular interest for a practical implementation of the FOL-correlator system is the use of a high power single mode semiconductor laser, as the optical pump.

According to the preceding description of the present invention, it will be appreciated that a system for optical correlation is offered which offers distinct advantages over the prior art.

It should be understood that the invention is not limited to the exact details of construction shown and described herein for obvious modifications will occur to persons skilled in the art.

I claim:

1. An optical correlator comprising:

a plurality of fiber optic laser members;

a plate having an array of apertures formed therein for receiving the fiber optic laser members;

an optical pump located at an input end of the fiber optic laser members;

light modulating means interposed between the pumping means and the fiber optic laser members for respectively modulating light carried by the fiber optic laser members;

wherein the light modulating means are individually and independently driven to aid detection of a single target, or multiple targets for which stored information exists, the orientation of one or more targets being determined by the highest output from the detecting means;

means located in optical alignment with the fiber optic laser members for storing optical information;

means for performing a Fourier transform of the information illuminated by the fiber optic laser members;

means located at the optical output of the transform means for optically filtering a Fourier transform of the stored optical information;

means located in optical alignment with the optical output of the filtering means for performing an inverse Fourier transform of an optically filtered information;

means for detecting the optical output of the inverse Fourier transform; and lens means interposed between the fiber optic laser array and the optical information storing means for collimating light beams emitted by the fiber optic laser array.

* * * * *